United States Patent
Ernst et al.

(10) Patent No.: US 7,117,403 B2
(45) Date of Patent: Oct. 3, 2006

(54) METHOD AND DEVICE FOR GENERATING DIGITAL SIGNAL PATTERNS

(75) Inventors: Wolfgang Ernst, München (DE); Gunnar Krause, München (DE); Justus Kuhn, München (DE); Jens Lüpke, München (DE); Jochen Müller, München (DE); Peter Pöchmüller, München (DE); Michael Schittenhelm, Poing (DE)

(73) Assignee: Infineon Technologies AG, Munich (DE)

( * ) Notice: Subject to any disclaimer, the term of this patent is extended or adjusted under 35 U.S.C. 154(b) by 461 days.

(21) Appl. No.: 09/907,777

(22) Filed: Jul. 18, 2001

(65) Prior Publication Data
US 2002/0009007 A1   Jan. 24, 2002

(30) Foreign Application Priority Data
Jul. 18, 2000 (DE) .................. 100 34 854

(51) Int. Cl.
  *G11C 29/00* (2006.01)
  *G06F 11/00* (2006.01)
  *G01R 31/28* (2006.01)

(52) U.S. Cl. .............. 714/718; 714/738; 714/742

(58) Field of Classification Search ........... 714/730, 714/743, 738, 739, 718; 711/3, 111, 117, 711/126, 127, 128
See application file for complete search history.

(56) References Cited

U.S. PATENT DOCUMENTS

| | | | |
|---|---|---|---|
| 4,586,181 A | | 4/1986 | Shimizu |
| 6,009,546 A | | 12/1999 | Kuglin et al. |
| 6,014,764 A | * | 1/2000 | Graeve et al. .............. 714/738 |
| 6,070,227 A | * | 5/2000 | Rokicki ...................... 711/117 |
| 6,073,263 A | | 6/2000 | Arkin et al. |
| 6,108,745 A | * | 8/2000 | Gupta et al. ................... 711/3 |
| 6,154,715 A | * | 11/2000 | Dinteman et al. .......... 702/120 |

* cited by examiner

*Primary Examiner*—Guy Lamarre
*Assistant Examiner*—John J. Tabone, Jr.
(74) *Attorney, Agent, or Firm*—Laurence A. Greenberg; Werner H. Stemer; Ralph E. Locher

(57) ABSTRACT

The method and the device generate digital signal patterns. Signal patterns or signal pattern groups are stored in a very small buffer register. The position of a following signal pattern or following signal pattern group is also stored in the form of a branch address, together with each signal pattern or each signal pattern group. A simple control logic circuit receives a control signal and determines whether the content of the currently addressed group is output continuously or the following group given by the branch address stored in the register is output after the currently selected group has been completely output. The novel method and device can advantageously be used for testing semiconductor memories and implemented in a cost-effective semiconductor circuit which is remote from a conventional test system.

18 Claims, 1 Drawing Sheet

| BSA [3:0] | REG 4 bit | | | |
|---|---|---|---|---|
| | BS [1] | BS [0] | A [10] | P |
| 0 0 0 0 | HSC 1 | | | BSA [3] |
| | HSC 2 | | | BSA [2] |
| | HSC 3 | | | BSA [1] |
| | HSC 4 | | | BSA [0] |
| 0 0 0 1 | HSC 1 | | | BSA [3] |
| | HSC 2 | | | ... |
| ... | ... | | | ... |
| 1 1 1 0 | HSC 1 | | | BSA [3] |
| | HSC 2 | | | ... |
| 1 1 1 1 | HSC 1 | | | BSA [3] |
| | HSC 2 | | | BSA [2] |
| | HSC 3 | | | BSA [1] |
| | HSC 4 | | | BSA [0] |

METHOD AND DEVICE FOR GENERATING DIGITAL SIGNAL PATTERNS

BACKGROUND OF THE INVENTION

Field of the Invention

The invention relates to a method and a device for generating digital electrical signal patterns. A multiplicity of different signal patterns or signal pattern groups which each contain a multiplicity of different signal patterns are formed in an addressable memory, and the signal patterns or the signal pattern groups are each stored in advance in the memory at an address which is peculiar to the respective signal pattern or the respective group, and are read out in response to corresponding addressing and made available. A definition which determines a reading out sequence of the stored signal patterns or signal pattern groups is also stored in the memory. Such a method and such a device are described in U.S. Pat. No. 6,014,764.

Hitherto, digital signal patterns have principally been generated by means of two different methods from a predefined quantity of available individual signals, for example for testing high-speed digital dynamic circuits, such as SDRAM memory modules. The signals or signal patterns are either generated by means of an algorithm and made available quasi online or made available in advance in the sequence which is required later. The first method is complex and can be problematic in terms of timing if a high frequency is desired while the signal patterns are being generated. To do this, a device is required which converts the predefined algorithm into the signal patterns and outputs them with the desired frequency.

If the signal patterns are to be provided already in the final form with the second method, they must be buffered. To do this, a very large memory is necessary under certain circumstances.

In a series of copending patent applications, we have presented the concept of a semiconductor module which is particularly suitable for production testing high-speed memory modules and is remote from a conventional test unit. That semiconductor module is referred to as a BOST (Built Outside Self Test) module and is conceived in such a way that it can be implemented as a small and cost-effective ASIC module and can generate and make available the address, data, clock and control signals required for the memory test in the immediate vicinity and in assignment to a memory module which is tested or which is to be tested. Such a BOST module operates with the high clock and signal frequency of the memory module and permits the previously available test systems which operate with a relatively low frequency to continue to be used. However, in such a BOST module, the device which implements the algorithm which is required for generating signal patterns according to the first method or a large volume memory which is required for carrying out the second abovementioned method can be accommodated only with difficulty and with increased costs for the module.

The above-mentioned U.S. Pat. No. 6,014,764 describes a method and a device for generating test vectors. Sample data are stored in a local memory and read out and output by addressing the memory using an address controller. In this publication it is also stated that a block (="signal pattern group") of pattern data (="signal patterns") in adjacent memory locations is referred to as a "pattern". What is referred to as "pattern chaining definition" for a set of the patterns which are designated as a pattern gives the sequence in which these patterns are read out of the memory. This pattern chaining definition can be set up as what is referred to as a pattern list and stored in the same memory. This pattern list can be used to concatenate the patterns to one another or to repeatedly output individual patterns in loop repetitions. However, not only the patterns themselves but also the 30 bit-wide pointer addresses, which indicate in the memory where the pattern region begins and ends, are stored in the pattern list.

SUMMARY OF THE INVENTION

It is accordingly an object of the invention to provide a method of the generic type for generating digital signal patterns and a device which is configured to carry out this method, which overcomes the above-mentioned disadvantages of the heretofore-known devices and methods of this general type and in which the combination possibilities during the generation of signal patterns are as large as possible and at the same time there is no need either for algorithmic systems or for a costly memory.

With the foregoing and other objects in view there is provided, in accordance with the invention, a method for generating digital electrical signal patterns, which comprises:

forming a multiplicity of different signal patterns or signal pattern groups each containing a multiplicity of different signal patterns in an addressable memory;

storing the signal patterns or the signal pattern groups each in advance in the memory at an address peculiar to the respective signal pattern or the respective signal pattern group;

also storing in the memory a definition determining a reading out sequence of the stored signal patterns or signal pattern groups, wherein the definition is given by a branch address stored in advance in the memory at a same address as any stored signal pattern or any signal pattern group and assigning a memory position for a subsequent signal pattern to be read out or a subsequent signal pattern group to be read out; and reading out and making available the signal patterns or the signal pattern groups in response to corresponding addressing as a function of the respective current address and of a fed-in control signal, in a sequence defined by a serial address or a memory sequence thereof or in a sequence determined by the respective branch address.

In accordance with an added feature of the invention, each signal pattern group is given by an address with the same number of signal patterns. In a specific embodiment, each signal pattern group given by an address has four signal patterns.

In accordance with an alternative feature of the invention, at least some (i.e., some or all) of the signal pattern groups contain a different number of signal patterns.

In accordance with an additional feature of the invention, each signal pattern has three bit locations.

In accordance with another feature of the invention, if the control signal is not activated, the currently addressed signal pattern or signal patterns of the currently addressed signal pattern group is continuously output.

In accordance with again another feature of the invention, if the control signal is not activated, the stored signal patterns or the signal pattern groups are continuously output in an order given by the serial addressing or their memory sequence, and, after the last signal pattern has been output, the process is continued with the outputting of the first stored signal pattern or of the first signal pattern of the first group.

In accordance with yet another feature of the invention, if the control signal is activated, the branching to the next signal pattern assigned by the branch address or to the start of the next signal pattern group assigned by the branch address takes place after the outputting of the currently addressed signal pattern or of the addressed signal pattern group has been completed.

In other words, the objects of the invention are achieved in accordance with a first aspect by the novel method for generating digital electrical signal patterns, in which a multiplicity of different signal patterns or signal pattern groups which each contain a multiplicity of different signal patterns are formed in an addressable memory, and these signal patterns or the signal pattern groups are each stored in advance in the memory at an address which is peculiar to the respective signal pattern or the respective group, and are read out in response to corresponding addressing and made available, a definition which determines a reading out sequence of the stored signal patterns or signal pattern groups also being stored in the memory, characterized in that the definition which determines the reading out sequence is given by a branch address which is stored in advance in the memory at the same address as any stored signal pattern or any signal pattern group and which assigns a memory position for a subsequent signal pattern which is to be read out or a subsequent signal pattern group which is to be read out, and in that either the current signal patterns or signal pattern groups are read out of the memory as a function of the respective current address and of a fed-in control signal, in the sequence given by the serial address or its memory sequence or in a sequence determined by the respective branch address (P).

In the method according to the invention, the signal states are stored individually or in groups in a very small buffer (register). Together with each signal state or each group of signal patterns, the position of a following signal state or of a following group of signal patterns which is output as a function of the additional control signal is also stored. The control signal here may be a simple digital yes/no signal.

The method according to the invention can be used to implement the following variants:
 (a) If the control signal is not active, the content of the currently selected, i.e. addressed group of signal patterns or the currently addressed signal pattern is output continuously.
 (b) In addition, when the control signal is not activated in each case the content of the directly following group of signal patterns is output. After the outputting of the last signal pattern group, the process continues with the outputting of the first signal pattern group.
 (c) When the control signal is activated, branching is carried out to the start of the following signal pattern group given by the branch address (pointer) after the current signal group (addressed with the current address) has been completely output. This signal pattern group is then output repeatedly (as a function of the state of the control signal) for as long as the control signal is active. If the control signal is no longer active, this signal pattern group is exited again, and the process is continued, for example, with the next signal pattern group or with the first, stored signal pattern group.

In a preferred use of the method for outputting a sequence of 3-bit signal patterns for the bank select signals when testing high-speed dynamic semiconductor memory modules, in particular 256 M SDRAMs which have four memory banks, each signal pattern group which is specified by means of an address has the same number of signal patterns, for example four signal patterns. Alternatively, each signal pattern group can also have a different number of signal patterns.

A device which is configured for carrying out the method according to the invention is defined by a control logic circuit which is connected to a buffer register having minimum register scope and being used for storing the aforethe signal pattern groups, and which has the purpose of addressing the buffer register and receiving the aforethe control signal. Such a relatively simple cost-effective device which occupies little chip area can be implemented in an integrated BOST semiconductor module which is remote from a conventional test unit, and can be used for testing high-speed, dynamic digital circuits such as SDRAMs, for example, and for generating addresses, for example bank select signals.

Other features which are considered as characteristic for the invention are set forth in the appended claims.

Although the invention is illustrated and described herein as embodied in a method and device for generating digital signal patterns, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figures 1, 2:
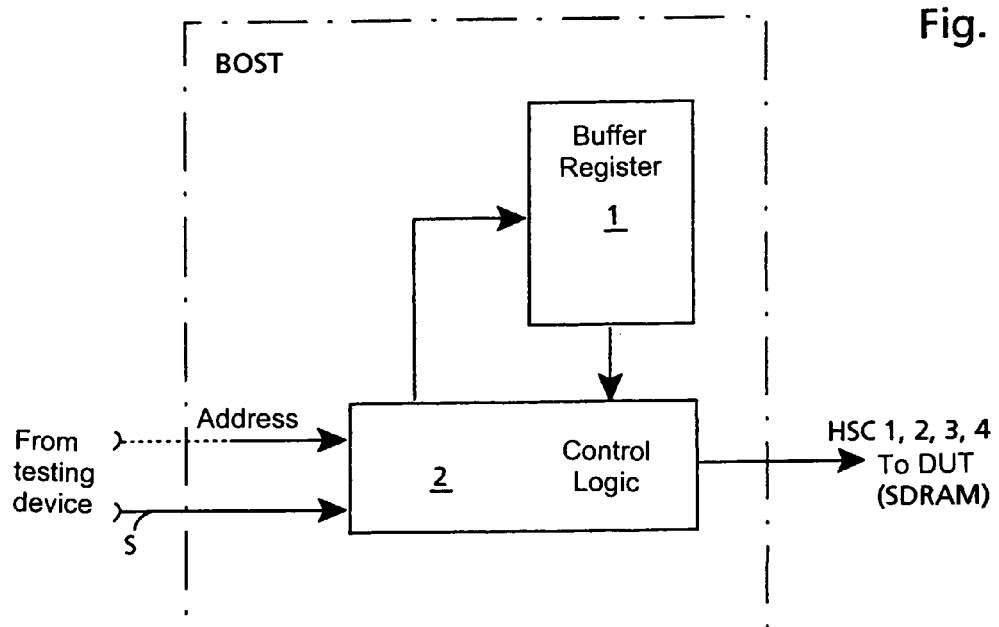
FIG. 1 is a schematic tabular view of an exemplary memory organization of a small buffer register used for storing signal pattern groups.
FIG. 2 is a block circuit diagram of the buffer register shown in FIG. 1 in conjunction with a control logic circuit.

Referring now to the figures of the drawing in detail and first, particularly, to FIG. 1 thereof, there is shown in table form the memory organization of a buffer register 1 which is conceived for carrying out the method according to the invention, in an application for generating 3-bit bank select signals for testing 256 M SDRAMs which have four memory banks. Sixteen signal pattern groups which have three bit locations BS[1], BS[0], A[10] and each comprise a sequence of four patterns HSC1, HSC2, HSC3 and HSC4 in column B are stored at the sixteen 4-bit addresses 0000-1111 given in column A. In the last column C, a branch address P is given for a following signal pattern group to an address in column A, which is branched to if the control signal S is activated.

In this way, the method according to the invention permits signal patterns for the bank select signals comprising three bit locations to be output periodically for testing a SDRAM. The signal patterns, for example HSC1, HSC2, HSC3 and HSC4, which are stored at the currently selected address, for example BSA=0000, are repeated cyclically if the control signal S is not activated.

With the alternative procedure mentioned, the content of the respectively directly following group of signal patterns is output if the control signal is not active. After the signal patterns of the last group have been output, the process continues with the first group.

If the control signal S is activated, the system branches to the start of the following group specified by the branch address P stored in column C after the signal pattern group selected by the current address has been completely output. That following group can then also be cyclically repeatedly read out or exited as a function of the control signal.

With reference to FIG. 2, there is shown an exemplary embodiment of a device according to the invention conceived in the form of a BOST solution. The schematic block circuit diagram includes a buffer register 1, implemented in a BOST (Build Outside Self Test) module in conjunction with a control logic circuit 2. The address BSA for selecting a respective signal pattern group at a given time in the buffer register 1 can be generated in the BOST module or be supplied from the outside by a test system. The control signal S is also supplied by the test system. The signal patterns HSC 1, 2, 3, 4 generated with the device according to the invention are fed to a digital semiconductor circuit DUT to be tested, for example a SDRAM.

It is to be noted that the method according to the invention and the device according to the invention have been described merely by way of example in an application in which bank select signal patterns comprising three bits are selected as a function of a current address BSA (in FIG. 1) and a control signal S in the buffer register 1.

However, the method according to the invention can also be used for periodically generating signal patterns for other applications. Reference is made here, merely by way of example, to an application of the method according to the invention for generating signal patterns for data signals, control signals etc. which are to be cyclically varied when testing high-speed semiconductor modules.

According to the above, the method and device according to the invention relate to a system for generating digital electrical signal patterns from a predefined quantity of available individual signals, there being no need for either costly algorithmic systems or costly memories. Instead, the invention implements such a signal pattern generating process with a minimum register scope and a simple control logic.

We claim:

1. A method for testing dynamic digital circuits by outputting digital electrical signal patterns, which comprises:
   providing an addressable memory and a control logic circuit, both as part of a common integrated semiconductor circuit;
   providing the integrated semiconductor circuit as a built outside test module remotely from a conventional test unit;
   forming a multiplicity of different signal patterns in the addressable memory;
   storing the signal patterns in advance in the memory at an address peculiar to the respective signal pattern;
   also storing under each address of each signal pattern in the memory in advance a definition in the form of a branch address determining a read-out order of the stored signal patterns and assigning a memory position for a signal pattern to be read out next; and
   reading out from the memory and outputting the signal patterns in response to corresponding addressing as a function of the respective current address and of a control signal to be fed in from the control logic circuit, when the control signal is not fed in, in a sequence defined by a serial address or a memory sequence thereof, and when the control signal is fed in, in a sequence determined by the respective branch address.

2. The method according to claim 1, wherein each signal pattern has three bit locations.

3. The method according to claim 1, which comprises, if the control signal is not activated, continuously outputting a currently addressed signal pattern.

4. The method according to claim 1, which comprises, if the control signal is not activated, continuously outputting stored signal patterns in an order given by the sequence defined by the serial address or the memory sequence, and, after a last signal pattern has been output, continuing the process with the outputting of a first stored signal pattern.

5. The method according to claim 1, wherein, if the control signal is activated, the branching to a next signal pattern assigned by the branch address takes place after the outputting of the currently addressed signal pattern has been completed.

6. The method according to claim 1, wherein the signal patterns are stored and output as a sequence of three-bit signal patterns for bank select signals in test equipment for testing high-speed dynamic semiconductor memory modules.

7. The method according to claim 6, wherein the dynamic semiconductor memory modules are 256 M SDRAMs with four memory banks.

8. The method according to claim 1, wherein the addressable memory is configured as a buffer register and a control logic circuit connected to the buffer register is configured for generating addresses for the buffer register.

9. The method according to claim 8, wherein the control logic circuit and the buffer register are forming a part of an integrated semiconductor circuit for testing the dynamic digital circuits and configured to generate bank select signals and implemented remotely from a conventional test unit.

10. The method according to claim 9 configured for testing SDRAM memory modules.

11. The method according to claim 1, which comprises, if the control signal is not activated, continuously outputting the multiplicity of signal pattern groups in sequence according to one of serial addressing and memory sequencing and branch address sequencing, and, after a last signal pattern has been output, continuing the process with the outputting of a first signal pattern of a first group.

12. A method for testing dynamic digital circuits by outputting digital electrical signal pattern groups, which comprises:
   providing an addressable memory and a control logic circuit, both as part of a common integrated semiconductor circuit;
   providing the integrated semiconductor circuit as a built outside test module remotely from a conventional test unit;
   forming a multiplicity of different signal pattern groups each containing a multiplicity of different signal patterns in an addressable memory;
   storing the signal pattern groups each in advance in the memory at an address peculiar to the respective signal pattern group;
   also storing under each address of each signal pattern group in the memory in advance a definition in the form of a branch address determining a read-out order of the stored signal pattern groups and assigning a memory position for a signal pattern group to be read out next; and
   reading out from the memory and outputting the signal pattern groups in response to corresponding addressing as a function of the respective current address and of a control signal to be fed in from the control logic circuit, when the control signal is not fed in, in a sequence defined by a serial address or a memory sequence, and, when the control signal is fed in, in a sequence determined by the respective branch address.

13. The method according to claim 12, which comprises defining each signal pattern group given by an address with the same number of signal patterns.

14. The method according to claim 12, wherein each signal pattern group given by an address has four signal patterns.

15. The method according to claim 12, wherein at least some of the signal pattern groups contain a different number of signal patterns.

16. The method according to claim 12, which comprises, if the control signal is not activated, continuously outputting a signal pattern or a plurality of signal patterns of a currently addressed signal pattern group.

17. The method according to claim 12, wherein, if the control signal is activated, the branching to the start of the next signal pattern group assigned by the branch address takes place after the outputting of a currently addressed signal pattern group has been completed.

18. The method according to claim 12, wherein each of the different signal patterns of the signal pattern groups are stored and output as a sequence of three-bit signal patterns for bank select signals in test equipment for testing high-speed dynamic semiconductor memory modules.

* * * * *